(12) United States Patent
Wilferd

(10) Patent No.: US 7,385,382 B2
(45) Date of Patent: Jun. 10, 2008

(54) QUICK REFERENCE TEST LIGHT PROBE WITH DIGITAL VOLTAGE METER

(76) Inventor: Randell Lee Wilferd, 1919 Carolyn Dr., Pleasant Hill, CA (US) 94523

( * ) Notice: Subject to any disclaimer, the term of this patent is extended or adjusted under 35 U.S.C. 154(b) by 0 days.

(21) Appl. No.: 11/598,667

(22) Filed: Nov. 14, 2006

(65) Prior Publication Data

US 2008/0111537 A1    May 15, 2008

(51) Int. Cl.
*G01R 31/02* (2006.01)
*G01R 27/08* (2006.01)

(52) U.S. Cl. .................. 324/72.5; 324/715; 324/724

(58) Field of Classification Search .............. 324/72, 324/72.5, 437, 445, 446, 751, 752, 754, 690, 324/696, 715, 724
See application file for complete search history.

(56) References Cited

U.S. PATENT DOCUMENTS

| | | | |
|---|---|---|---|
| 3,689,832 A * | 9/1972 | Leto et al. ............... 324/707 |
| 3,922,095 A * | 11/1975 | Lee ........................ 356/225 |
| 4,366,434 A * | 12/1982 | Ellis ....................... 324/556 |
| 4,954,783 A * | 9/1990 | Spry ....................... 324/696 |
| 5,617,018 A * | 4/1997 | Earle ...................... 324/72.5 |
| 6,014,027 A * | 1/2000 | Reichard ................. 324/623 |
| 6,462,552 B1 * | 10/2002 | Suzuki ................... 324/458 |
| 6,812,685 B2 * | 11/2004 | Steber et al. ........... 324/72.5 |
| 2006/0028194 A1 * | 2/2006 | Bosch .................... 324/72.5 |
| 2007/0181789 A1 * | 8/2007 | Abrate et al. .......... 250/227.16 |

* cited by examiner

*Primary Examiner*—Andrew H Hirshfeld
*Assistant Examiner*—Hoai-An D Nguyen
(74) *Attorney, Agent, or Firm*—Novak Druce + Quigg LLP

(57) ABSTRACT

The present invention relates to a quick reference electrical voltage testing tool utilizing a variable voltage range light bulb and digital read out voltage meter both incorporated in the testing tool's handle. The variable voltage range light bulb indicates to the user the knowledge of voltage present and the digital voltage read out indicates the measured amount of voltage available to the tested component. This allows for a faster diagnosis of an electrical problem particularly when voltage sensitive components are being tested. When testing electrical components for non-operation, this quick reference tool will allow a much quicker diagnoses of an electrical problem without the need of a voltage meter.

16 Claims, 2 Drawing Sheets

QUICK REFERENCE TEST LIGHT PROBE WITH DIGITAL VOLTAGE METER

BACKGROUND OF INVENTION

1. Field of the Invention

This invention relates to a quick reference tool used to test 12 volt direct current electrical voltage and primarily designed for automotive applications.

2. Background of the Related Art

Commonly used today for electrical testing is a quick reference 12 volt test light probe equipped with a variable voltage light bulb. The light bulb having a variable range from 7 to 16 volts indicates electrical power to an electrical component however, the exact amount of voltage is not indicated and the amount of voltage could be too little or too much to operate the component. As an example most vehicles today use multi voltage electrical components in the operation of the vehicle. While most automotive vehicles utilize a 12 volt direct current systems many electrical components operate on lesser voltage such as the on board computer and sensors. The sensors are used to relay messages back to the computer for changing engine operations. Some of these components may require as little as 3 volts to function. When diagnosing sensitive electrical components such as compute sensors, some quick reference testing tools on the market today allow voltage to flow in both directions, in and out. If a technician should make an improper connection and allows voltage to flow to a grounded electrical component, the influx of positive voltage could further damage the component. A common practice for diagnoses of a vehicle experiencing a drivability problem is the technician will check component voltage using the quick reference 12 volt test light probe to check the presence of voltage. Once the verification of voltage is present the technician should re-verify the amount of voltage with a voltage meter. This two step process causes more time spent on the diagnoses. If the technician does not use a voltage meter for the accurate measurement of voltage present could lead to a false indication causing more time spent on the diagnosing of the electrical problem. The proper tool needed to check accurate voltage is a common voltage meter. However, due to hands on multiple wire connections needed to operate the voltmeter and the placement of some electrical components inside a vehicle, it can at times be very awkward to use and could require 2 technicians for voltage testing. The present invention incorporates a test light and digital voltage meter in the handle. The light portion allows for the quick reference of voltage present while the digital voltage meter allows for the accurate voltage reading. The present invention eliminates the need for the 2 step voltage checking process and the possible need of the second technician for an accurate voltage check.

BRIEF SUMMARY OF THE INVENTION

The present invention is designed for direct current voltage testing unitizing a variable resistance light bulb which indicates a range of voltage present and a digital read out voltmeter for an accurate reading of the voltage. Both of these operating components are incorporated inside the handle of the testing tool. Both a positive and negative voltage source is needed to supply power to the testing tool. The negative grounding lead exits from the handle of the testing tool and connects to a grounding source on the vehicle. The positive voltage needed to power the testing tool is drawn from the component being tested. The positive voltage is channeled to the microprocessor voltage chip associated with the testing tool which measures the variable resistance of the voltage present and compensates for the voltage draw needed to power the testing tool providing the user with the accurate measurement of voltage. The microprocessor chip only allows voltage to flow in one direction. This eliminates the possibility of a wrong electrical connection being made by the technician with positive voltage flowing in the wrong direction and damaging the electrical component being tested. The housing or handle of the testing tool is designed to allow the user the ability to change the length of the testing tool probe where the positive voltage enters into the testing tool. A more appropriate length probe or an optional spring loaded connection clip, (designed for hands free operation), allows the user easier access to the component being tested and allows the diagnosis to be a 1 man operation.

DETAILED DESCRIPTION OF THE PREFERRED EMBODIMENTS

Figure 1:
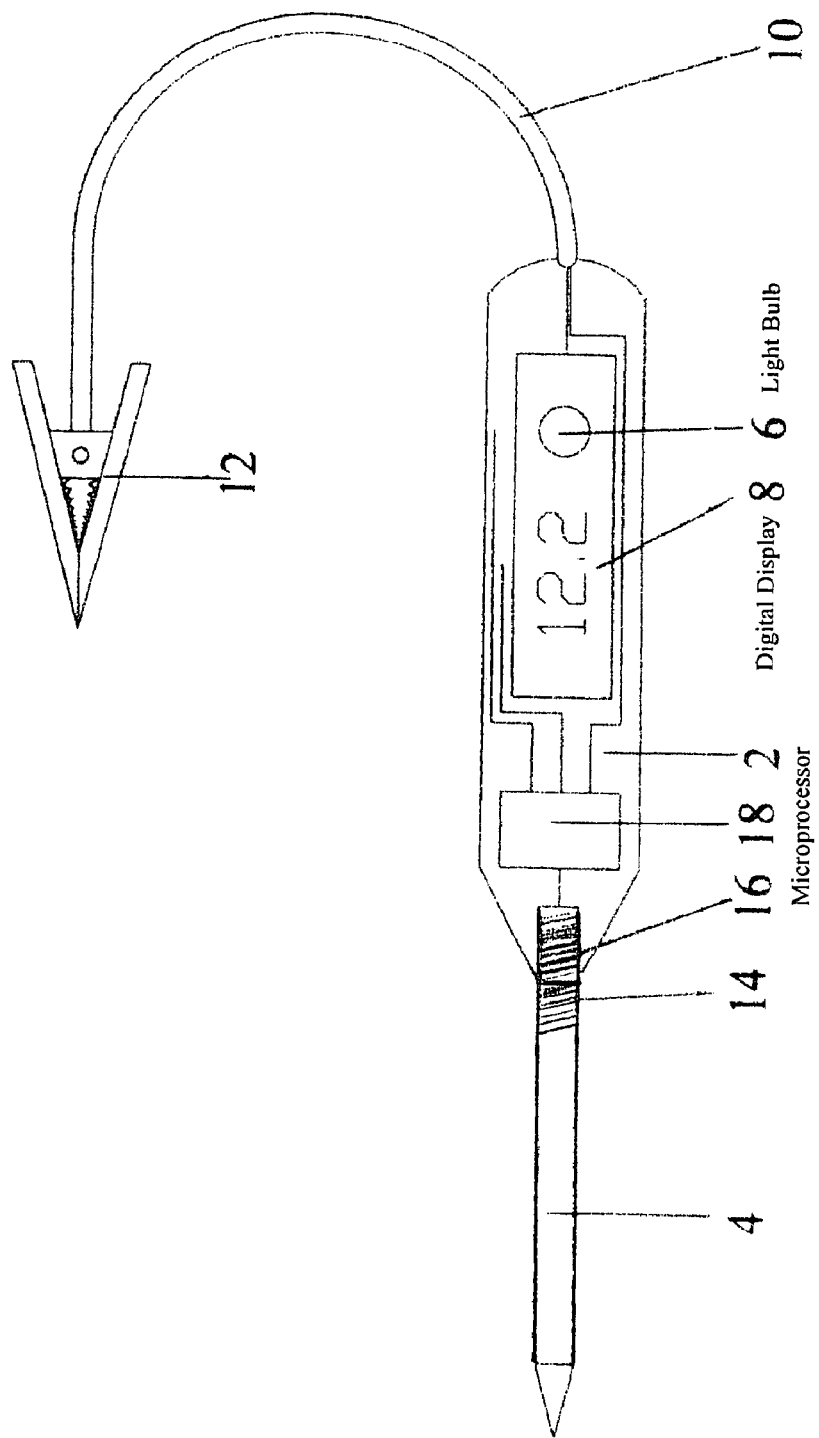
FIG. 1 illustrates the perspective side view of the present invention.

FIG. 1. The present invention consisting of a variable voltage light bulb 6 used to indicate the presents of voltage and a liquid crystal digital read out display 8 used to display a digital read out of the measurement of voltage present, with both the light bulb 6 and volt meter display 8 being incorporated inside a main body housing handle 2. Attached to the main body housing handle 2 is a metal, voltage conducting probe 4 with a tapering tip coming to a shape point at one end of the probe 4. This allows penetration into a common electrical wire outer protective installation coating and also provides a path for the electrical voltage to flow from the wire metal core to the micro voltage processor chip 18. The micro voltage processor chip 18 is used to transfer a signal of both the presence of voltage to the variable voltage light bulb 6 and the amount of voltage to the digital read out volt meter display 8. In order to activate the testing probe a complete electrical circuit has to be made. This requires a grounding wire 10 to be connected to a grounding source. The grounding wire 10 is held to the grounding source by a spring loaded metal connection clip 12. The main body housing handle 2 is also designed for the replacement of the metal, voltage conducting probe 4. This allows the user to select different length probes for different applications needed for the diagnoses of the electrical problem. The probe 4 having a male machine screw thread 14 at the opposite end from the tapered tip, and mates to the female machine screw threads 16, located in the bottom portion of the main body housing handle 2 which allows for a solid connection between the two components.

Figure 2:
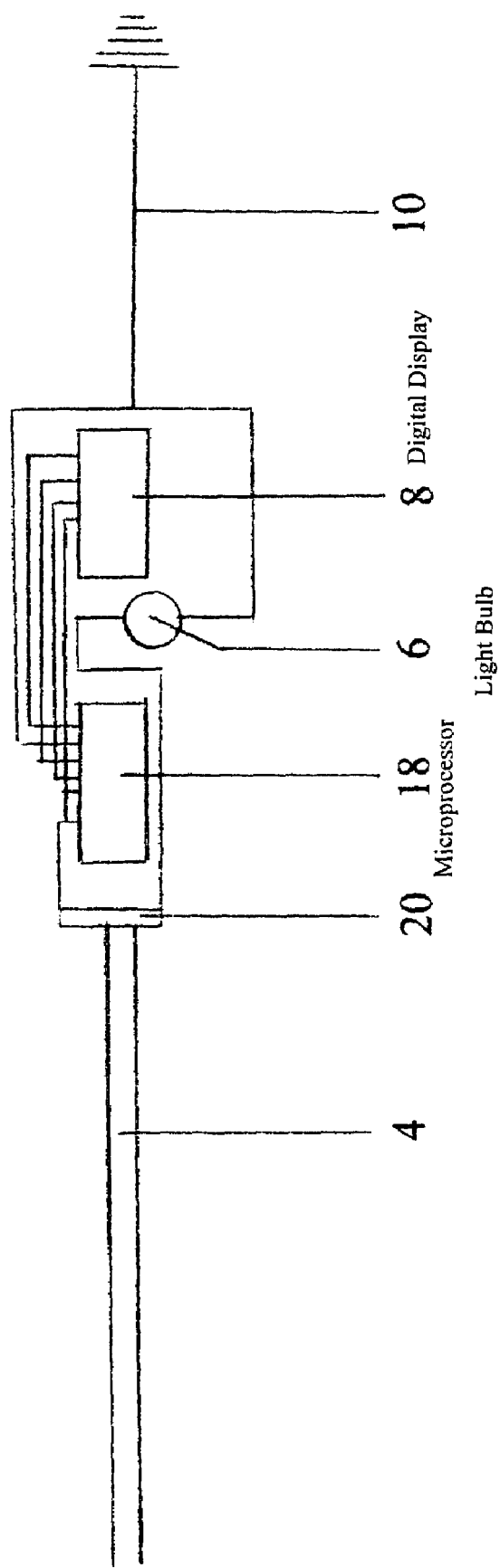
FIG. 2 illustrates the electrical circuit of the present invention.

FIG. 2 illustrates the electrical circuit needed to power all components of the present invention. A grounding source is needed to complete the electrical circuit, the unit's grounding wire 10 connects to a negative ground source supplying the present invention with a negative energy to power all electrical components of the tool. Positive energy is also needed to complete the electrical circuit and to power the tool. Positive energy is supplied from a positive source or possibly from the component being tested and conducts this energy from the tool's prove 4 to a main connection point 20 located in the handle housing. The micro voltage processor chip 18 measures the voltage and relays the signal of the presence of power to both the variable voltage light bulb 6, which lights up when voltage is present and to the liquid crystal display 8, which displays a digital read out of the voltage that's present.

While various modifications, changes and alternative are suggestible to one skilled in the art based on the descriptions set forth above, the invention is to be given the broadest interpretation based on the scope of the appended claims.

What is claimed is:

1. A voltage testing tool comprising;
   a handle made of a plastic material;
   said handle comprising a digital volt meter display;
   a negative grounding lead extending from the handle;
   said handle also comprising a microprocessor;
   a voltage conducting probe being in electrically conducting relationship to said microprocessor;
   wherein said microprocessor only allows voltage to flow in one direction.

2. A kit comprising the voltage testing tool of claim 1 and a plurality of voltage conducting probes.

3. The kit of claim 2, wherein at least two of the plurality of voltage conducting probes differ in length.

4. The kit of claim 2, wherein at least one of the plurality of voltage conducting probes is a spring loaded connection clip.

5. The kit of claim 4, wherein at least one of the plurality of voltage conducting probes is metal having on one end a threaded connection and at another end a tapering tip.

6. The voltage testing tool of claim 1, wherein said voltage conducting probe is threadedly connected to said handle.

7. The voltage testing tool of claim 6, wherein said voltage conducting probe comprises a tapered tip remote from said connection to said handle.

8. The voltage testing tool of claim 1, further comprising a light bulb.

9. The voltage testing tool of claim 1, further comprising a variable voltage light bulb.

10. The voltage testing tool of claim 1, wherein the positive voltage necessary to power the tool is drawn from an electrical component being tested by the tool.

11. The voltage testing tool of claim 1, wherein the end of the handle remote from the grounding lead comprises means to connect to a voltage conducting probe.

12. The voltage testing tool of claim 11, wherein said means to connect comprises female machine screw threads.

13. The voltage testing tool of claim 1, wherein said microprocessor comprises a compensation program to permit the testing tool to operate while allowing for an accurate voltage reading.

14. The voltage testing tool of claim 1, wherein said digital display comprises a liquid crystal display.

15. The voltage testing tool of claim 1, wherein the voltage conducting probe comprises a spring loaded connection clip.

16. The voltage testing of claim 1, wherein said handle is a clear plastic.

* * * * *